United States Patent
Tsai et al.

[11] Patent Number: 6,143,653
[45] Date of Patent: Nov. 7, 2000

[54] METHOD OF FORMING TUNGSTEN INTERCONNECT WITH TUNGSTEN OXIDATION TO PREVENT TUNGSTEN LOSS

[75] Inventors: Nien-Yu Tsai, Taipei; Hong-Long Chang; Chun-Wei Chen, both of Hsin-Chu; Ming-Li Kung, Chi-Lung, all of Taiwan

[73] Assignees: ProMos Technologies, Inc.; Mosel Vitelic, Inc., both of Hsinchu, Taiwan; Seimens AG, Munich, Germany

[21] Appl. No.: 09/186,303

[22] Filed: Oct. 4, 1998

[51] Int. Cl.$^7$ ..................................................... H01L 21/44
[52] U.S. Cl. .......................... 438/669; 438/725; 438/720; 438/672
[58] Field of Search .................................. 438/618, 669, 438/725, 720, 672

[56] References Cited

U.S. PATENT DOCUMENTS

| | | | |
|---|---|---|---|
| 5,480,748 | 1/1996 | Bakeman, Jr. et al. | 430/11 |
| 5,567,271 | 10/1996 | Chu et al. | 156/659.11 |
| 5,776,832 | 7/1998 | Hsieh et al. | 438/669 |

OTHER PUBLICATIONS

J. Hackenburg, et al. "Effects of Plasma Stripping on the Oxidation states of Al and W surfaces", J. Vac. Sci. & Eng., vol. 6, No. 3, pp. 1388–1392, May 1988.

P.–L. Pai, et al. "Metal corrosion in wet resist–stripping process", Microelectronic Manufacturing and Testing, vol. 13, No. 2, pp. 37–39 May 1988.

S. Bothra, et al. "A New Failure Mechanism by Corrosion of Tungsten in a Tungsten Plug Process" IEEE $36^{th}$ Annual Int. Reliability Physics Symp., Mar. 1998.

*Primary Examiner*—Caridad Everhart
*Attorney, Agent, or Firm*—Blakely Sokoloff Taylor & Zafman LLP

[57] ABSTRACT

A method of forming a metal interconnect structure and via plugs over a dielectric layer having a plurality of vias formed therein is disclosed. The method comprises the steps of: forming tungsten via plugs in the plurality of vias; depositing a metal layer over the dielectric layer and the plurality of tungsten via plugs; patterning and etching the metal layer using a photoresist layer to form the metal interconnect structure; oxidizing the metal interconnect structure and the tungsten via plugs to form a metal oxide layer over the metal interconnect structure and tungsten via plugs; and performing a wet strip on the metal interconnect structure.

12 Claims, 2 Drawing Sheets

METHOD OF FORMING TUNGSTEN INTERCONNECT WITH TUNGSTEN OXIDATION TO PREVENT TUNGSTEN LOSS

FIELD OF THE INVENTION

The present invention relates to an improved method of metal interconnect etching, and more particularly, to a method of reducing tungsten loss due to wet stripping after metal interconnect etching.

BACKGROUND OF THE INVENTION

The process of forming a metal interconnect layer and the associated conductive via plugs that connect different interconnect layers is an important process in the manufacture of integrated circuits. In this process, via plugs are first formed in the vias formed in an underlying dielectric layer. The dielectric layer is typically an oxide and includes multiple vias that extend from the top of the insulative dielectric layer down to an underlying metal interconnect, landing pad, contact pad, or semiconductor substrate. Typically, the via plugs are formed by depositing a tungsten layer using a chemical vapor deposition process or physical vapor deposition sputtering process. Then, either a metal chemical mechanical polishing (CMP) or an etch back technique is used to remove the tungsten lying outside the vias.

Next, a second metal layer, such as aluminum, is blanket deposited over the dielectric layer and over the via plugs. Once the second metal layer has been blanket deposited over the oxide, a photoresist layer is deposited, patterned, and developed over the second metal layer. The photoresist layer is patterned to reflect the desired metal interconnect pattern. Next, using a plasma etching technique, the metal layer is etched using the patterned photoresist layer as a mask. After the etching of the second metal layer is complete, the photoresist is removed. Although not particularly relevant to the present invention, in manufacturing practice, a thin titanium/titanium nitride layer is typically deposited to act as an adhesion layer between the oxide and the metal layers.

One common method of removing the photoresist is by "ashing." The ashing is performed in a plasma asher, typically by using an oxygen plasma. However, it has been found that the ashing process often times leaves a polymer residue on the surface of the wafer. Additionally, another side effect of the ashing process by oxygen plasma is an increase in the charge on the wafer. The charge will be typically stored in floating lines.

In order to remove the polymer residue, a wet stripper is used. However, it has been found that the wet stripper, especially when the wet stripper is an alkaline solvent, reacts with the tungsten plugs in the vias. The reaction causes erosion of the tungsten as well as increasing the contact resistance of the tungsten. This phenomena is described in "A New Failure Mechanism by Corrosion of Tungsten in a Tungsten Plug Process" by S. Bothra et al., Technology Department, VLSI Technology Inc. (1998). It can be appreciated that the tungsten in the vias is exposed because of imperfect overlay of the metal interconnect pattern over the vias or design requirements.

Therefore, what is needed is a method of effectively forming a metal interconnect while protecting the tungsten plugs in the vias from erosion.

SUMMARY OF THE INVENTION

A method of forming a metal interconnect structure and via plugs over a dielectric layer having a plurality of vias formed therein is disclosed. The method comprises the steps of: forming tungsten via plugs in said plurality of vias; depositing a metal layer over said dielectric layer and said plurality of tungsten via plugs; patterning and etching said metal layer using a photoresist layer to form said metal interconnect structure; oxidizing said metal interconnect structure and said tungsten via plugs to form a metal oxide layer over said metal interconnect structure and tungsten via plugs; and performing a wet strip on said metal interconnect structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
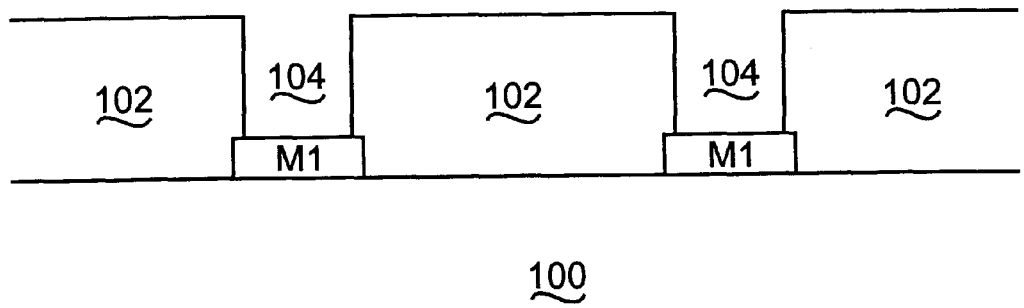
FIGS. 1–4 illustrate in cross section the steps in forming a tungsten metal interconnect in accordance with the present invention.

Turning to FIG. 1, a substrate 100 is shown having placed thereon metal lines Ml. The metal lines Ml on the substrate 100 are merely exemplary of the types of underlying semiconductor structures to which an overlying metal interconnect layer may be connected. Thus, the term substrate is meant to include underlying semiconductor devices formed on or in a semiconductor substrate or intermediate level devices.

The metal lines Ml illustrate an exemplary first level of metal interconnect. Above the substrate 100 and the metal lines Ml is a dielectric layer 102. Typically, the dielectric layer 102 is an oxide such as borophosphosilicate glass (BPSG), silicon dioxide, spin on glass (SOG), or any combination of the above and other types of dielectric nitrides or oxides.

Formed within the dielectric layer 102 are vias 104. The vias 104 extend from the top of the dielectric layer 102 down to the metal lines Ml. These vias are used as conductive pathways between two layers of metal interconnects. The vias are formed using conventional photolithography and etching. In this particular embodiment, the vias 104 are located above the metal lines Ml. However, it can be appreciated that other vias may also extend down to the substrate 100.

Figure 2:
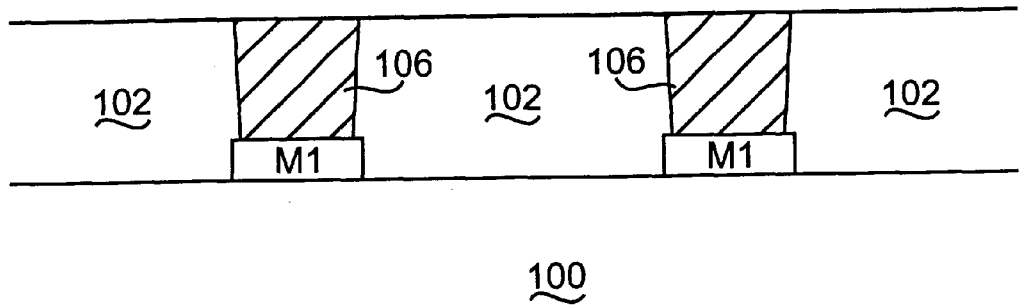

Next, turning to FIG. 2, conductive via plugs 106 are formed in the vias 104. Typically, the via plugs 106 are formed by depositing a tungsten layer using a chemical vapor deposition process or physical vapor deposition sputtering process. Then, either a metal chemical mechanical polishing (CMP) or an etch back technique is used to remove the tungsten lying outside the vias.

Figure 3:
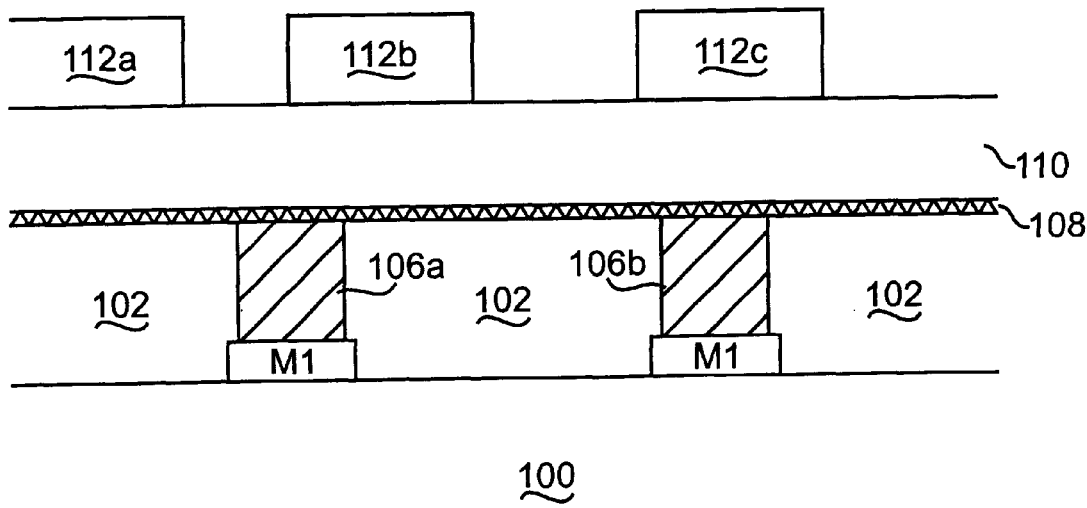

Next, turning to FIG. 3, a thin titanium/titanium nitride layer 108 is formed over the dielectric layer 102 and the via plugs 106. Then, a metal layer 110 is deposited over the Ti/TiN layer 108. Typically, the metal layer 110 is formed from aluminum to a thickness of 5000 angstroms.

Next, a photoresist layer 112 is deposited onto the aluminum layer 110. The photoresist layer 112 is then exposed and developed in accordance with a predetermined pattern that corresponds to the desired pattern of the metal interconnect structure to be formed. An exemplary pattern is shown in FIG. 3. As seen in FIG. 3, portions of the photoresist layer 112 remain to protect those areas of the metal layer 110 that are to remain after etching.

However, as seen in FIG. 3, one of the photoresist blocks 112b is misaligned to one of the via plugs 106a. This misalignment is due to difficulty in aligning a later photoresist mask pattern directly over via plugs. This problem becomes more difficult as critical dimensions become smaller and smaller.

Figure 4:
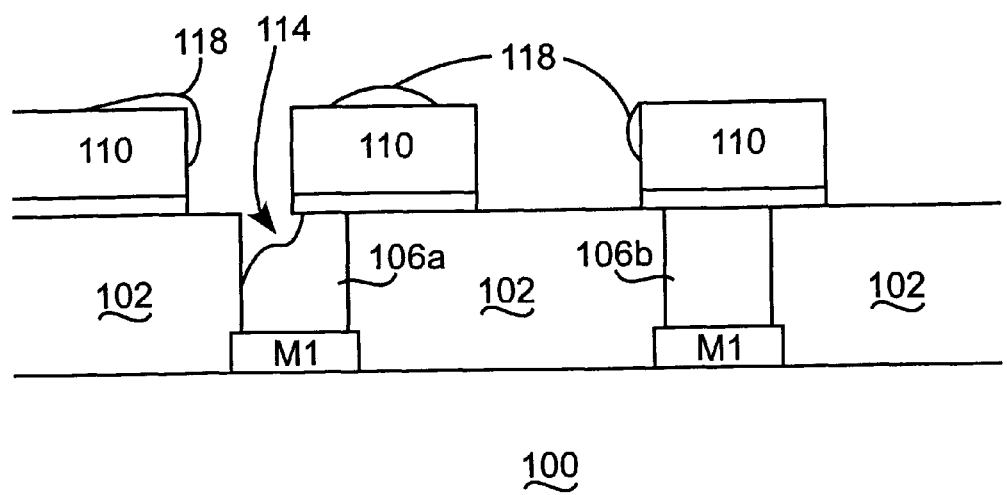

The resulting structure after etching is shown in FIG. 4. Because of the misalignment, a portion 114 of the via plug 106a is exposed. This exposed tungsten 114 is susceptible to erosion as will be seen below.

After the aluminum layer 110 has been etched, the remaining photoresist blocks 112 are removed. Preferably, the photoresist blocks 112 are removed in an asher.

Although effective to remove most of the photoresist, the ashing process does not remove the polymer 118 that adheres to the aluminum 110. The polymer 118 is formed during the etching of the aluminum layer 110.

In order to remove the polymer 118, a wet stripper is used in the prior art process. Typically, the wet stripper is an alkaline solvent. However, it has been found that the alkaline solvent used to remove the polymers 118 reacts adversely with the aluminum 110. This is particularly damaging to the tungsten in the vias which the metal lines do not completely cover. The reaction of the alkaline solvent to the tungsten is amplified by the charging on the wafers due to the prior art oxygen plasma ashing.

In order to solve this difficulty, the present invention teaches that after the ashing step, the surface of metal layer 110 and the tungsten via plugs 106 are oxidized. The oxidation step forms a protective barrier layer between the aluminum layer 106 and tungsten via plugs 106 from the wet stripper.

In the preferred embodiment, after the ashing step, an oxidation step is performed. The oxidation step is preferably either a thermal oxidation in a steam ambient, an oxygen flow shower with a lamp heating, or a chemical treatment. Specifically, in one preferred embodiment, oxygen is flowed at a rate of 4000 sccm at 250 degrees Celsius using a heat lamp to assist the oxidation. This is preferably done with a GaSonics Model L3510 asher. In an alternative embodiment, a chemical treatment using a chromium phosphorous acid (CP) solvent may be used to form the oxidation film. Preferably, the solvent is applied at 25 degrees Celsius for 2–4 minutes. Finally, a furnace may be used to thermally oxidize the aluminum and tungsten. The oxidation of the aluminum and tungsten may take place over and through the polymer 118.

The tungsten oxide layer results in a lower erosion rate of the tungsten and less contact resistance in the tungsten layer. After the formation of the tungsten oxide, a wet stripping step is performed to remove the polymer 112. The wet stripping process is preferably performed by dipping the wafer into an alkaline solution, such as EKC 265 or ACT 935.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a metal interconnect structure and via plugs over a dielectric layer having a plurality of vias formed therein, the method comprising:

forming tungsten via plugs in said plurality of vias;

depositing a metal layer over said dielectric layer and said plurality of tungsten via plugs;

patterning and etching said metal layer using a photoresist layer to form said metal interconnect structure;

after patterning and etching said metal layer, removing said photoresist layer using an ashing process;

oxidizing said metal interconnect structure and said tungsten via plugs to form a metal oxide layer over said metal interconnect structure and tungsten via plugs; and subsequent to the oxidizing of said metal interconnect, performing a wet strip on said metal interconnect structure.

2. The method of claim 1 wherein said metal layer is aluminum.

3. The method of claim 1 wherein said dielectric layer is an oxide layer.

4. The method of claim 1 wherein said step of oxidizing is performed by thermal oxidation in a steam ambient.

5. The method of claim 1 wherein said step of oxidizing is performed by chemical treatment.

6. The method of claim 1 wherein said step of oxidizing is performed by an oxygen flow shower and lamp heating.

7. A method of forming a metal interconnect structure and tungsten via plugs over a dielectric layer having a plurality of vias formed therein, said vias being filled with said tungsten via plugs, the method comprising:

depositing a metal layer over said dielectric layer and over said tungsten via plugs;

patterning and etching said metal layer using a photoresist layer to form said metal interconnect structure;

after patterning and etching said metal layer, removing said photoresist layer using an ashing process;

oxidizing said metal interconnect structure and any exposed tungsten via plugs to form a metal oxide layer over said metal interconnect structure and said exposed tungsten via plugs; and subsequent to the oxidizing of said metal interconnect, performing a wet strip on said metal interconnect structure.

8. The method of claim 7 wherein said metal layer is aluminum.

9. The method of claim 7 wherein said dielectric layer is an oxide layer.

10. The method of claim 7 wherein said step of oxidizing is performed by thermal oxidation in a steam ambient.

11. The method of claim 7 wherein said step of oxidizing is performed by chemical treatment.

12. The method of Claim 7 wherein said step of oxidizing is performed by an oxygen flow shower and lamp heating.

* * * * *